(12) United States Patent
Wang et al.

(10) Patent No.: US 10,872,793 B2
(45) Date of Patent: Dec. 22, 2020

(54) SYSTEM AND METHOD FOR MONITORING OPERATION CONDITIONS OF SEMICONDUCTOR MANUFACTURING APPARATUS

(71) Applicant: TAIWAN SEMICONDUCTOR MANUFACTURING CO., LTD., Hsinchu (TW)

(72) Inventors: Chih-Yu Wang, Taichung (TW); Tien-Wen Wang, Hsinchu (TW); Hsin-Hui Chou, Hsinchu County (TW); In-Tsang Lin, Kaohsiung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 9 days.

(21) Appl. No.: 16/129,746

(22) Filed: Sep. 12, 2018

(65) Prior Publication Data
US 2019/0148191 A1 May 16, 2019

Related U.S. Application Data

(60) Provisional application No. 62/584,471, filed on Nov. 10, 2017.

(51) Int. Cl.
*H01L 21/67* (2006.01)
*H04R 1/04* (2006.01)
*H04R 1/08* (2006.01)
*B24B 49/00* (2012.01)
*B24B 49/10* (2006.01)

(52) U.S. Cl.
CPC ...... *H01L 21/67253* (2013.01); *B24B 49/003* (2013.01); *B24B 49/10* (2013.01); *H01L 21/67288* (2013.01); *H04R 1/04* (2013.01); *H04R 1/08* (2013.01)

(58) Field of Classification Search
None
See application file for complete search history.

(56) References Cited

U.S. PATENT DOCUMENTS

| | | | |
|---|---|---|---|
| 6,282,459 B1 * | 8/2001 | Ballantine | G01H 1/00 235/375 |
| 2005/0092089 A1 * | 5/2005 | Gilgunn | H01L 21/67259 73/587 |
| 2008/0002832 A1 | 1/2008 | Chen et al. | |

(Continued)

FOREIGN PATENT DOCUMENTS

| | | |
|---|---|---|
| CN | 101097835 A | 1/2008 |
| CN | 105140160 A | 12/2015 |

(Continued)

*Primary Examiner* — Angel Roman
(74) *Attorney, Agent, or Firm* — McDermott Will & Emery LLP (57) ABSTRACT

In a method of operating an apparatus for manufacturing or analyzing semiconductor wafers, sound in a process chamber of the apparatus during an operation of the apparatus is detected. An electrical signal corresponding to the detected sound is acquired by a signal processor. The acquired electrical signal is processed by the signal processor. An event during the operation of the apparatus is detected based on the processed electrical signal. The operation of the apparatus is controlled according to the detected event.

20 Claims, 8 Drawing Sheets

(56) References Cited

U.S. PATENT DOCUMENTS

| | | | | |
|---|---|---|---|---|
| 2010/0129940 A1* | 5/2010 | Little | ............... | H01L 21/67742 |
| | | | | 438/14 |
| 2014/0241836 A1 | 8/2014 | Kondoh | | |
| 2015/0235881 A1* | 8/2015 | Adderly | ............ | H01L 21/67259 |
| | | | | 29/407.01 |
| 2015/0340258 A1* | 11/2015 | Hiyashi | ............ | H01L 21/67772 |
| | | | | 414/416.03 |
| 2016/0187302 A1* | 6/2016 | Satoh | .................... | G01N 29/34 |
| | | | | 73/574 |

FOREIGN PATENT DOCUMENTS

| | | | |
|---|---|---|---|
| JP | 2014165439 A | 9/2014 | |
| KR | 20080071814 A | 8/2008 | |
| KR | 20150139212 A | 12/2015 | |
| TW | 201444012 A | 11/2014 | |
| WO | 2006043511 A1 | 4/2006 | |

* cited by examiner

SYSTEM AND METHOD FOR MONITORING OPERATION CONDITIONS OF SEMICONDUCTOR MANUFACTURING APPARATUS

RELATED APPLICATIONS

This application claims priority of Provisional Patent Application No. 62/584,471 filed on Nov. 10, 2017, the entire contents of which are incorporated herein by reference.

TECHNICAL FIELD

This disclosure relates to chemical mechanical polishing methods used in semiconductor manufacturing processes, and an apparatus for chemical mechanical polishing.

BACKGROUND

In manufacturing semiconductor devices, various types of equipment are utilized. The equipment includes process apparatuses to process semiconductor wafers and inspection apparatuses. Generally, these apparatuses are well maintained, however the apparatuses may operate abnormally due to various reasons.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure generally relates to methods and apparatuses for monitoring and controlling one or more semiconductor manufacturing or analyzing apparatuses. More particularly, the methods and apparatuses described herein facilitate monitoring the operating conditions of the apparatuses to detect anomalous behavior.

Figure 1:
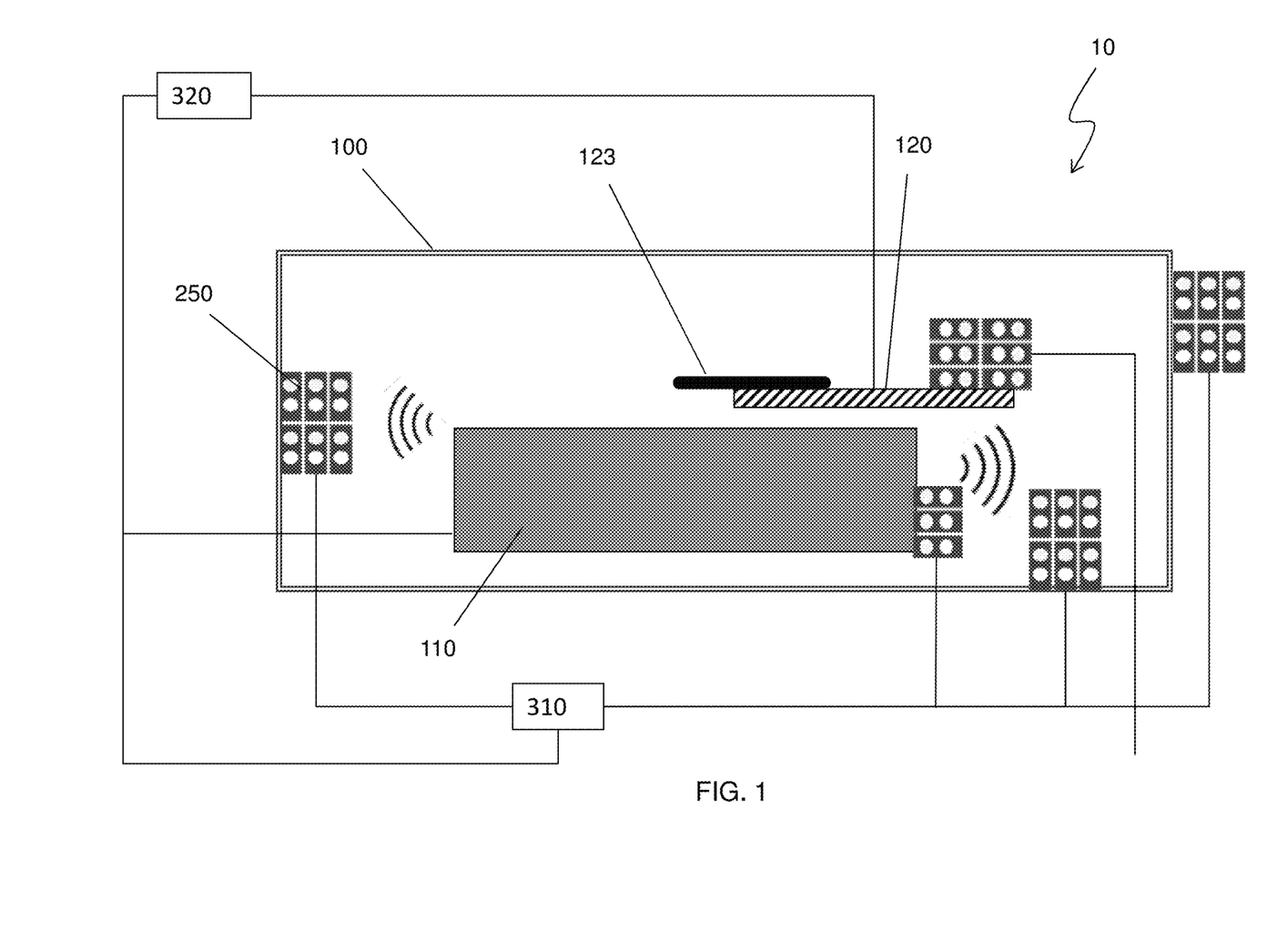
FIG. 1 is a schematic view of an apparatus in normal operation for a semiconductor manufacturing operation in accordance with an embodiment.
Figure 2:
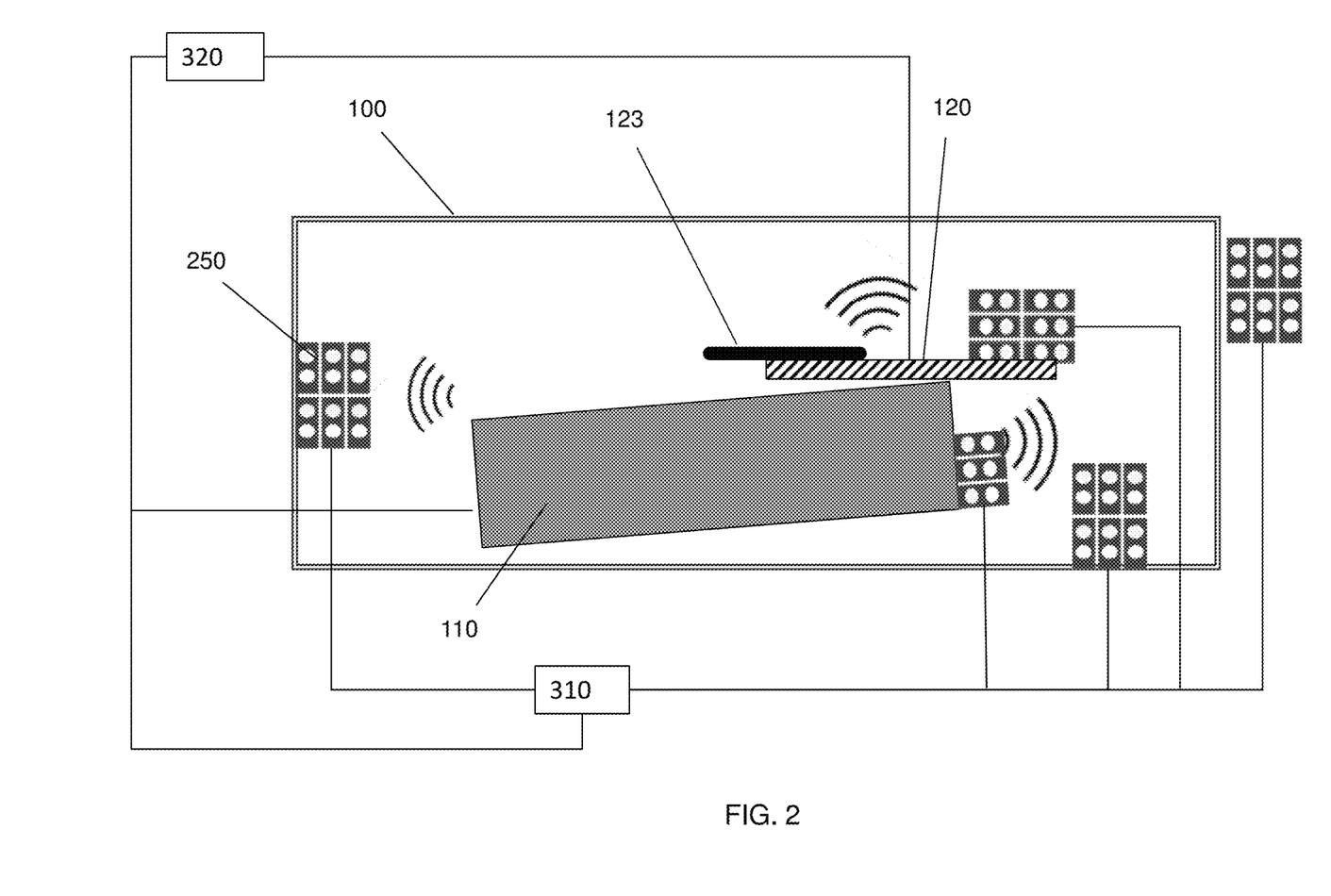
FIG. 2 is a schematic view of an apparatus in abnormal operation for a semiconductor manufacturing operation in accordance with an embodiment.
Figure 3:
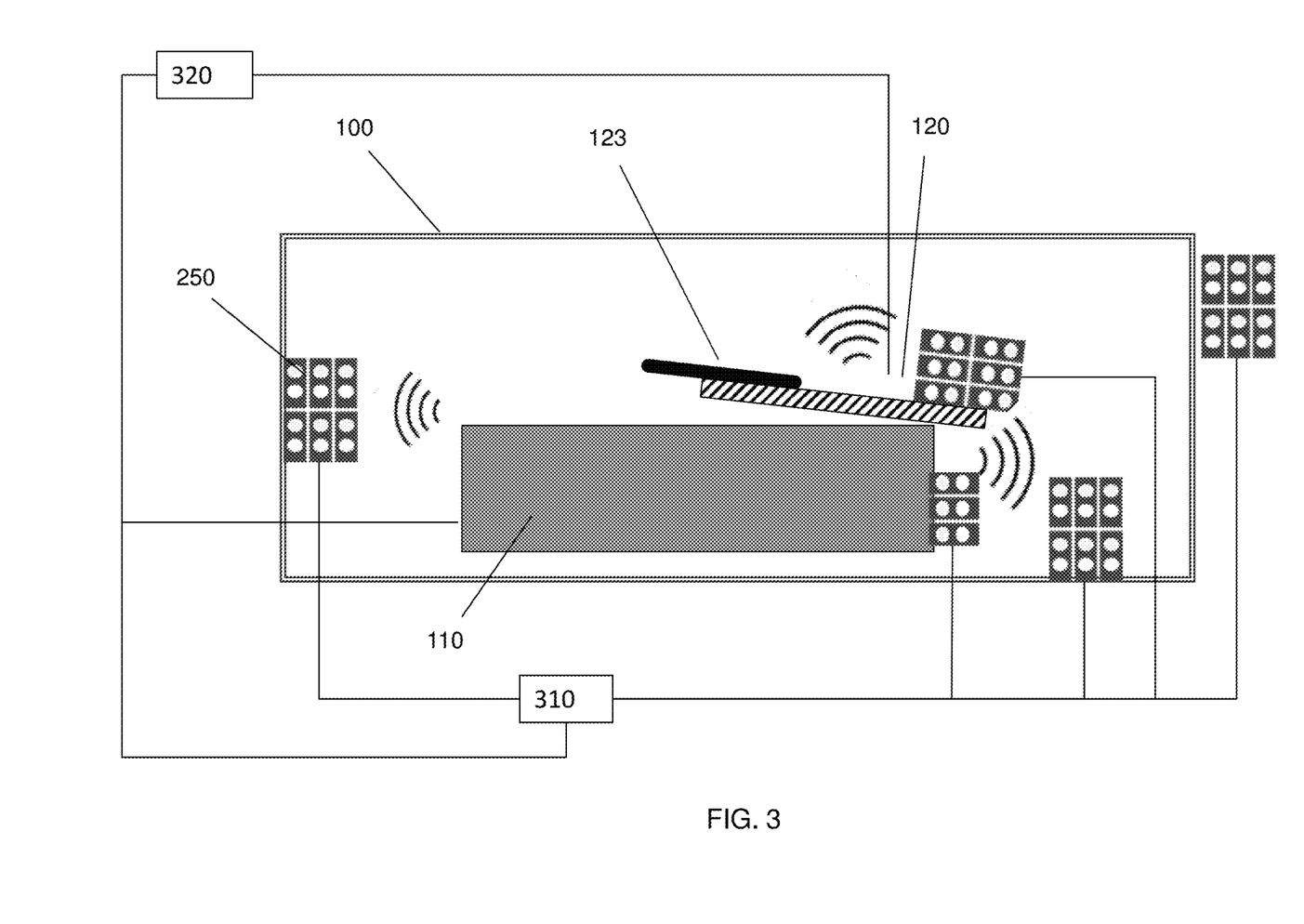
FIG. 3 is a schematic view of an apparatus in abnormal operation for a semiconductor manufacturing operation in accordance with an embodiment.

FIGS. 1-3 show schematic views of a semiconductor manufacturing or analyzing apparatus according to an embodiment of the present disclosure. FIG. 1 shows a situation of the apparatus in a normal operation, and FIGS. 2 and 3 show situations of the apparatus in an abnormal operation. In the present disclosure, "an abnormal operation" includes, but not limited to, a mechanical error, a mechanical failure, wear-and-tear, an operation that may cause damage to a semiconductor wafer, an operation that may require immediate assistance and/or maintenance or any other situation that prevents the apparatus from being operated. Further, in some embodiments, the abnormal operation includes a forecast event that will soon result in a mechanical failure and/or damaging a wafer. An abnormal operation, condition or movement includes, for example, but not limited to, a wafer scratch by a moving or non-moving part of the equipment, a butting of a moving part, a movement slower or faster than a predetermined or intended speed of a movable part, loosing of parts, piling-up of particles or dusts, mis-handling a wafer (dropping), mis-alignment of a wafer to a handler, a stage and/or a wafer stocker, or any other mechanical issues, which would produce a specific sound. Further, an abnormal operation, condition or movement includes abnormal gas flow when injecting a gas into a chamber or exhausting a gas from or vacuuming the chamber.

In some embodiments of the present disclosure, the semiconductor manufacturing or analyzing apparatus 10 includes a wafer stage 110 on which a semiconductor wafer 123 is placed and a wafer handling mechanism 120 (e.g., a wafer handler) to transfer the wafer 123 to and from the wafer stage 110. In some embodiments, the wafer stage 100 can move horizontally in X-Y directions and/or vertically in a Z direction.

In some embodiments, the semiconductor manufacturing or analyzing apparatus 10 is accommodated in a process chamber 100. Although not shown in FIG. 1, the process chamber 100 includes a wafer inlet and/or outlet port, such as a load lock chamber, so that the semiconductor wafer 123 can be transferred into the process chamber 100 from the outside. In some embodiments, the process chamber 100 can be air tight so that pressure of the process chamber 100 can be reduced. In other embodiments, the process chamber 100 is open-air.

Examples of the semiconductor manufacturing or analyzing apparatus 10 include a manufacturing apparatus, such as, but not limited to, a plasma etching apparatus, a chemical vapor deposition (CVD) apparatus, a sputtering deposition apparatus, an atomic layer deposition (ALD) apparatus, an epitaxial growth apparatus, an annealing apparatus, a thermal oxidation apparatus, an ion implantation apparatus, a lithography apparatus, a wet process apparatus, or any other apparatus used for processing semiconductor wafers; and an analyzing apparatus, such as, but not limited to, a critical dimension (CD) measurement apparatus including a scanning electron microscope (SEM) and an optical microscope, a film thickness measurement apparatus, an overlay measurement apparatus, a particle and/or defect inspection apparatus, an electrical property measurement apparatus or any other apparatus used for analyzing and measuring processed semiconductor wafers.

As shown in FIG. 1, one or more monitor devices 250 are disposed inside or outside of the process chamber 100. In some embodiments, the one or more monitor devices 250 are a vibration monitor device. In certain embodiments, the vibration monitor device is a microphone.

Mechanical movement of the wafer handling mechanism 120 and/or the wafer stage 110 produces characteristic sounds within the process chamber 100. When the process chamber 100 and/or any other parts of the semiconductor manufacturing or analyzing apparatus 10 include a movable parts, such movable parts may also produce characteristic sounds by its movement. The movable parts include a wafer stage, a lifting pin in the wafer stage, a wafer handling mechanism, a valve, an open/close gate, a movable cover, or any other movable parts in some embodiments.

Figure 4A:
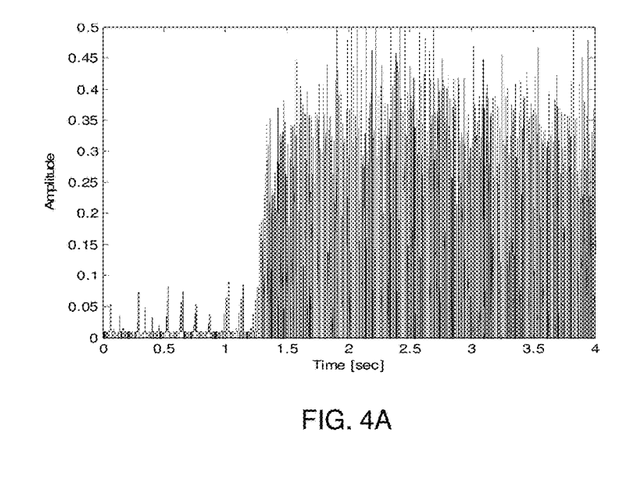
FIGS. 4A and 4B are simulated time and frequency domain plots of sound emanating from the operating apparatus in normal operation in accordance with an embodiment.
Figure 4B:
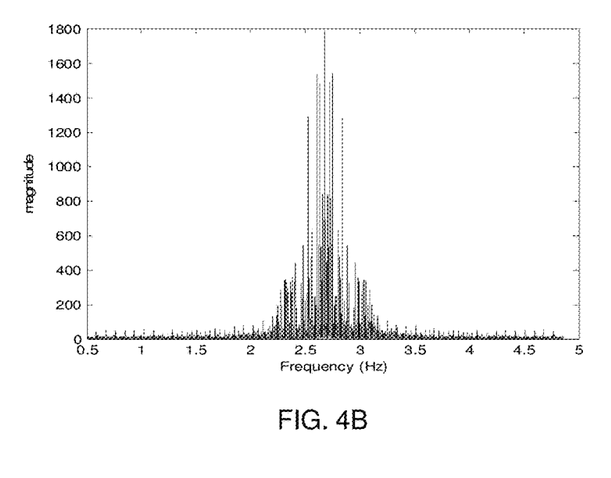

FIG. 4A shows an example of the characteristic sounds detected by one or more microphones 250 in the time domain and FIG. 4B shows an example of the characteristic sounds in the frequency domain, when the semiconductor manufacturing or analyzing apparatus 10 operates normally. The amplitude and frequency of the characteristic sounds inside and/or outside the process chamber 100 may depend on operations and/or movements of the parts of the semiconductor manufacturing or analyzing apparatus 10. In FIG. 4B, the average magnitude from time=0 sec to time=4 sec is shown.

For example, the semiconductor manufacturing or analyzing apparatus 10 produces different characteristic sounds when the wafer transfer mechanism 120 transfers the wafer 123, when the wafer transfer mechanism 120 places the wafer 123 on the wafer stage 110 and the wafer transfer mechanism 120 picks up the wafer 123 from the wafer stage 110. The semiconductor manufacturing or analyzing apparatus 10 may produce different characteristic sounds when the wafer stage 110 moves up and when the wafer stage 110 moves down. The semiconductor manufacturing or analyzing apparatus 10 may produce different characteristic sounds during wafer processing and/or wafer analysis.

Although not seen in the figures, in some embodiments the sound spectrum includes sounds of frequencies as low as fractions of a hertz (e.g., 0.01 Hz) to frequencies as high as several ten or hundred megahertz (e.g., 20 MHz to 200 MHz).

When the semiconductor manufacturing or analyzing apparatus 10 operate normally, the characteristic sounds corresponding to each of the operations and/or movements are substantially the same, and the sound spectra in the time and frequency domains remain substantially the same.

In contrast, when there is an abnormal operation, condition or movement in the semiconductor manufacturing or analyzing apparatus 10, the sound spectrum should change.

FIGS. 2 and 3 schematically illustrate a semiconductor manufacturing or analyzing apparatus 10 operating abnormally.

In FIG. 2, since the wafer stage 110 has been misaligned with respect to the wafer handling mechanism 120, a part of the wafer handling mechanism 120 (e.g., an arm) collides with a part of the wafer stage 110 during a wafer transfer movement. In such a case, the collision of the part of the wafer handling mechanism 120 and the part of the wafer stage 110 produces abnormal sounds. Similarly, as shown in FIG. 3, when the wafer handling mechanism 120 is misaligned with respect to the wafer stage 110, a part of the wafer handling mechanism 120 collides with a part of the wafer stage 110 during a wafer transfer movement. In such a case, the collision of the part of the wafer handling mechanism 120 and the part of the wafer stage 110 produces abnormal sounds. Such abnormal sounds can be detected by the one or more microphones 250.

Figure 5A:
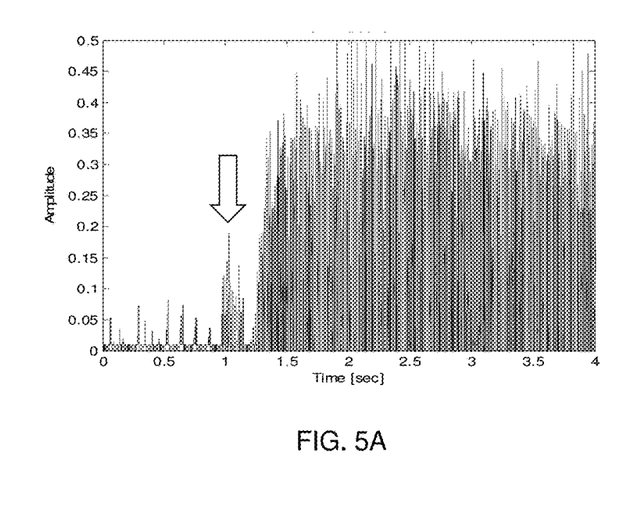
FIGS. 5A and 5B are simulated time and frequency domain plots of sound emanating from the operating apparatus in abnormal operation in accordance with an embodiment.
Figure 5B:
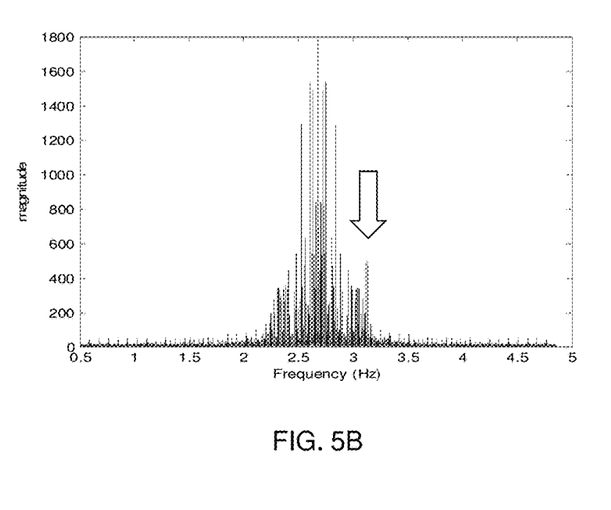

FIG. 5A shows an example of the characteristic sounds detected by one or more microphones 250 in the time domain and FIG. 5B shows an example of the characteristic sounds in the frequency domain, when the semiconductor manufacturing or analyzing apparatus 10 operates abnormally. In FIG. 5B, the average magnitude from time=0 sec to time=4 sec is shown.

As shown in FIG. 5A, at the time=about 1 sec, abnormal sounds caused by, for example, a collision of two parts are detected by the microphones 250, and corresponding peaks can be observed at about 3.2 Hz in the frequency domain shown in FIG. 5B.

Changes in the sound spectrum, thus, indicate an abnormal operation and/or movement of the semiconductor manufacturing or analyzing apparatus 10. As set forth above, a collision of two parts which should otherwise not occur causes the abnormal sounds in some embodiments. In other embodiments, an abnormal movement of the wafer handling mechanism 120 caused by, for example, wear-and-tear of movable components causes another type of abnormal sounds. In other words, the sound spectra of the abnormal sounds caused by different abnormal events are different from each other.

As shown in FIGS. 1-3, the semiconductor manufacturing or analyzing apparatus 10 includes one or more microphones 250 disposed inside and/or outside the process chamber 100 of the semiconductor manufacturing or analyzing apparatus 10. The semiconductor manufacturing or analyzing apparatus 10 further includes a signal processor 310 operatively connected to the one or more microphones 250 and configured to receive and process an electrical signal from the one or more microphones 250. The semiconductor manufacturing or analyzing apparatus 10 further includes an apparatus controller 320 operatively connected to the various movable mechanisms of the semiconductor manufacturing or analyzing apparatus 10 and the signal processor 310. The apparatus controller 320 is configured to receive a signal from the signal processor 310 and control the operation and/or movement of movable mechanisms of the semiconductor manufacturing or analyzing apparatus 10 based on the signal. In some embodiments, the apparatus controller 320 and the signal processor 310 are different devices, and in other embodiments, the signal processor 310 is a part of the apparatus controller 320.

In some embodiments, the one or more microphones 250 are chosen to optimize the collection of the sounds from the semiconductor manufacturing or analyzing apparatus 10. For example, the one or more microphones 250 include a single wide-band microphone designed to detect sound in the range of about 0.01 Hz to about 200 MHz. In other embodiments, the one or more microphones 250 include several narrow-band microphones tailored to detect specific frequency ranges. For example, the one or more microphones 250 may include one or more infrasonic microphones designed to detect sounds of frequencies from about 0.01 Hz to about 20 Hz, one or more acoustic microphones designed to detect sounds of frequencies from about 20 Hz to about 20 kHz (audible range) and one or more ultrasonic microphones designed to detect sounds from about 20 kHz to about 200 MHz (ultrasonic range). An example of infrasonic microphones includes, but is not limited to, an electret condenser microphone. Examples of acoustic and ultrasonic microphones include, but are not limited to, piezoelectric microphones, capacitive microphones, moving coil microphones, or optoacoustic microphones.

In some embodiments, the one or more microphones 250 are disposed at one or more locations inside and/or outside the process chamber 100 of the semiconductor manufacturing or analyzing apparatus 10 to detect the sounds.

In some embodiments, one or more microphones 250 are disposed on one or more locations on or near an inner wall of the process chamber 100. The one or more microphones 250 can be directly attached to the inner wall in some embodiments, or can be attached to the process chamber 100 by an attachment device (a support). In other embodiments, one or more microphones 250 are disposed on or near movable elements of the semiconductor manufacturing or analyzing apparatus 10. For example, one or more microphones 250 are disposed on or near the wafer stage 110, and one or more microphones 250 are disposed on or near the wafer handling mechanism 120. The one or more microphones 250 can be directly attached to the movable elements in some embodiments, or can be attached to the movable elements by an attachment device (a support). In other embodiments, one or more microphones 250 are disposed at or near a location where two movable elements cross over during their operations and/or movements. Further, in certain embodiments, one or more microphones 250 are disposed outside the process chamber 100. For example, one or more microphones 250 are disposed on or near an outer wall of the process chamber 100.

In some embodiments, the distribution and placement of the microphones is optimized based on the frequency and amplitude of sound anticipated at a particular location inside and/or outside the process chamber 100. It is expected that higher frequency sounds are directional and attenuate in a radial direction. For such sounds, narrow-band microphones designed to detect directional sounds are used in certain embodiments.

In some embodiments, one or more infrasonic microphone are disposed on a top wall of the process chamber 100, one or more narrow-band acoustic microphones collectively spanning the entire acoustic spectrum (i.e., about 20 Hz to about 20 kHz) are disposed on sidewalls of the process chamber 100, one or more narrow-band ultrasonic microphones collectively spanning a sound spectrum ranging from about 20 kHz to about 200 MHz are disposed on a bottom-side of the wafer stage 110, and one or more narrow-band ultrasonic microphones collectively spanning a sound spectrum ranging from about 20 kHz to about 200 MHz are disposed on the wafer handling mechanism 120. However, the arrangements and types of the microphones are not limited to the above configurations.

In some embodiments, each of the one or more microphones 250 is hard-wired to the signal processor 310 so as to transmit electrical signals corresponding to the detected sounds. In other embodiments, each of the one or more microphones 250 transmits the electrical signals corresponding to the detected sounds wirelessly to the signal processor 310. For example, the microphones transmit the electrical signals to the signal processor 310 using a wireless communication protocol such as, but not limited to, Bluetooth, or IEEE 802.11 (Wi-Fi) in certain embodiments. Other types of wireless communication protocols, including proprietary protocols, are contemplated within the scope of the present disclosure.

In an embodiment, the signal processor 310 includes one or more non-transitory computer-readable memories, an interface configured to receive the electrical signals from the one or more microphones 250 and one or more processors configured to process the received electrical signals and analyze the electrical signals. Signal processing includes, without limitation, synchronizing the electrical signals and filtering the electrical signals to reduce noise.

In some embodiments, the one or more microphones 250 are spatially dispersed within the process chamber 100 and unsynchronized to facilitate installation of the microphones. In such embodiments, synchronization of the electrical signals received from the various microphones at the signal processor 310 may be performed if necessary. In an embodiment, synchronizing the electrical signals includes generating a timing signal having a frequency substantially disjoint from the frequencies of the unsynchronized electrical signals, transmitting the timing signal to each of the microphones, receiving a combined signal including a combination of the timing signal and a corresponding unsynchronized electrical signal from each of the microphones, and separating each of the combined signals to recover the unsynchronized electrical signal and the timing signal and aligning the unsynchronized signals according to the recovered timing signal to produce synchronized electrical signals. In such embodiments, it is contemplated that frequency of the timing signal is chosen such that there is negligible, if any, overlap in energy with the unsynchronized electrical signals so as to avoid drowning out information contained in the electrical signals. For example, in some embodiments, the timing signal has a frequency in the gigahertz (GHz) region where the electrical signals received from the one or more microphones 250 have very little or no energy.

In an embodiment, all of the microphones 250 are synchronized using a signal from the apparatus controller 320. For example, the apparatus controller 320 transmits an "initiate detection" signal to each of the microphones simultaneously and each of the microphones begins detecting the sound signals in response to receiving the "initiate detection" signal in some embodiments.

The apparatus controller 320 also acquires operational signals indicating each operation and/or movement of the various parts of the semiconductor manufacturing or analyzing apparatus 10. The apparatus controller 320 synchronizes the "initiate detection" signal with a start of the operation and/or movement of the various parts of the semiconductor manufacturing or analyzing apparatus 10 in some embodiments. Thus, sound detection (and thereby generation of electrical signals) at each of the microphones is synchronized with the start of the operation and/or movement of the various parts of the semiconductor manufacturing or analyzing apparatus 10. Other methods of synchronizing the electrical signals from the unsynchronized microphones are contemplated within the scope of the present disclosure.

In an embodiment, the signal processor 310 is configured to filter the electrical signals received from each of the microphones 250 to reduce ambient sound and noise so as to improve the signal to noise ratio (SNR). Various methods for filtering electrical signals are known in the art and will not be detailed herein.

Signal analysis includes, without limitation, sound source position detection, time domain analysis of the sound spectrum, conversion of the electrical signal from the time domain to the frequency domain, frequency domain analysis of the sound spectrum, decomposition of the signals, pattern recognition, pattern comparison, pattern matching, etc. In some embodiments, the detected sounds are filtered and/or smoothened by a filtering circuit and/or a smoothing circuit before the frequency-domain conversion. In the frequency domain, adjacent peaks may be smoothly connected to form a "spectral curve" of the sound, which can be used in pattern recognition, pattern comparison and/or pattern matching operations.

In certain embodiments, the signal processor 310 is configured to detect the position of a source of the sounds. The source of the sounds may be detected using a triangulation algorithm. For example, in cases where the microphones 250 are unsynchronized, the microphones 250 are composed to have three or more microphones having identical bandwidth and frequency sensitivities disposed inside and/or outside the process chamber 100 in some embodiments. The band-width and central frequency of the three or more microphones are chosen, for example, following a frequency domain analysis of the sound spectrum during the operations and/or movements of the movable parts of the operation and/or movement of the various parts of the semiconductor manufacturing or analyzing apparatus 10, to maximize the strength of the sound signals received or detected at the three or more microphones in some embodiments. Following a synchronization process, a time difference in the arrival of the specific sound received at the three or more microphones may then be used to calculate the distance of the source of the sound from each of the three or more microphones, which in turn is used to calculate the location of the source of the sounds.

In embodiments where the microphones 250 are synchronized, e.g., through the apparatus controller 320, the signal processor 310 is configured to receive the synchronized electrical signals, process the signals to detect a common pattern in signals from microphones that detect sounds in an overlapping frequency band and calculate a time difference between the common pattern coming from different microphones. A position of a source of that common pattern is calculated based on the time difference by using the positions of the microphones providing the common pattern.

In various embodiments, algorithms such as, for example, Fourier transform (e.g., fast Fourier transform (FFT), discrete Fourier transform (DFT), etc.), Laplace transform, or wavelet transform are employed to convert the time domain signals to frequency domain signals.

Pattern recognition may include a model-based method or a machine-learning method. In some embodiments, a model-based method is used for recognizing patterns in the sound spectrum following synchronization of all electrical signals received from the microphones 250. In the model-based method, a model for the sound spectrum for a normal operation and/or movement of the various movable parts of the semiconductor manufacturing or analyzing apparatus 10 is generated using regression analysis performed over several normal operations and/or movements of the various parts of the semiconductor manufacturing or analyzing apparatus 10. Two or more model sound spectra can be obtained and stored in the system for various parts and/or movements. Generally, different movements cause different sounds, and thus different sound spectra are obtained and stored in relation to the different movements. For example, the signal processor 310 recognizes a collision of the part of the wafer handling mechanism 120 and the part of the wafer stage 110 based on a model for sound spectra for a collision of the part of the wafer handling mechanism 120 and the part of the wafer stage 110.

In some embodiments, the signal processor 310 is configured to "learn" normal sound spectra of the characteristic sounds of the operations and/or movements of the various movable parts of the semiconductor manufacturing or analyzing apparatus 10, and stores the normal sound spectra. The signal processor 310 compares the signal spectra received from the one or more microphones 250 with the model sound spectra in synchronization with the operations and/or movements of the various movable parts of the semiconductor manufacturing or analyzing apparatus 10. When a deviation from the model sound spectra exceeds a threshold value, the signal processor can detect an abnormal operation in some embodiments. In some embodiments, a pattern matching process is utilized to determine whether the signal spectra received from the one or more microphones 250 is different from the model sound spectra. When a matching score is less than a threshold value (e.g., 70-90%, where 100% means a perfect match), the signal processor determines that there is an abnormal condition. By comparing the signal spectra received from the one or more microphones 250 with two or more model sound spectra for different parts or movements, it is possible to determine what type of abnormality occurs. In other embodiments, intensity in the frequency domain for one or more specific frequency values or ranges is monitored. When the intensity becomes larger than the intensity at a normal operation (pre-stored) beyond a predetermined amount (e.g., 10-30% or more), the signal processor determines that there is an abnormal condition. The specific frequency values or ranges can be obtained in advance by intentionally causing an abnormal operation.

In some embodiments, once a pattern for the sound spectra (interchangeably referred to herein as the "sound pattern") is recognized, the signal processor 310 generates a feedback signal including information relating to the operation and/or movement of the various movable parts of the semiconductor manufacturing or analyzing apparatus 10 based on the sound pattern, and transmits the feedback signal to the apparatus controller 320. The feedback signal may simply be an "all OK" signal if the sound pattern indicates a normal operation and/or movement.

In contrast, if the pattern of sound spectra indicates an abnormal operation and/or movement, the feedback signal indicates to the apparatus controller 320 that an abnormal or anomalous event has occurred. In such cases, the feedback signal includes information about the anomalous event indicating, for example, the type of event and the source of abnormality.

In an embodiment, the apparatus controller 320 includes one or non-transitory computer-readable memories, an interface configured to receive the feedback signal from the signal processor 310 and one or more processors to analyze the feedback signal and control the operations and/or movements of the various movable parts of the semiconductor manufacturing or analyzing apparatus 10. In some embodiments, when the apparatus controller 320 receives a feedback signal indicating occurrence of an abnormal event, the apparatus controller 320 stops the operations and movements of the semiconductor manufacturing or analyzing apparatus 10. In certain embodiments, if the abnormal event is minor or a self-recoverable, the apparatus controller 320 can continue the operations and movements of the semiconductor manufacturing or analyzing apparatus 10. The log for occurrences of abnormal events is stored in apparatus controller 320, and/or is transmitted to a central server that manages the entire semiconductor manufacturing process/equipment, in some embodiments.

In the foregoing embodiments, a microphone is utilized as a vibration monitor device 250. In other embodiments, a vibration sensor that can detect a vibration of a physical part of the semiconductor manufacturing or analyzing apparatus 10 is used as the vibration monitor device 250. In such a case, one or more vibration sensors are attached to an inner wall and/or an outer wall of the process chamber 100, to the wafer stage 110 and/or the wafer handling mechanism 120 to detect vibration of each part.

Similar to the sound detection cases as set forth above, the operation and/or movement of the various movable parts of the semiconductor manufacturing or analyzing apparatus 10 produce characteristic vibrations generally unique to the operation and/or movement of the various movable parts of the semiconductor manufacturing or analyzing apparatus 10. For example, the semiconductor manufacturing or analyzing apparatus 10 produces different characteristic vibration when the wafer transfer mechanism 120 transfers the wafer 123, when the wafer transfer mechanism 120 places the wafer 123 on the wafer stage and the wafer transfer mechanism 120 picks up the wafer 123 from the wafer stage. The semiconductor manufacturing or analyzing apparatus 10 may produce different characteristic vibrations when the wafer stage 110 moves up and when the wafer stage 110 moves down. The semiconductor manufacturing or analyzing apparatus 10 may produce different characteristic vibration during wafer processing and/or wafer analysis.

In some embodiments, the vibrations detected by the one or more vibration sensors are analyzed by the signal processor 310. The vibration signals for a normal operation of each of the operations and/or movements of various movable parts of the semiconductor manufacturing or analyzing apparatus 10 are repeatedly acquired and stored in the signal processor 310. The signal processor can generate a model for vibration spectrum for each of the operations and/or movements of various movable parts of the semiconductor manufacturing or analyzing apparatus 10.

During an operation of the semiconductor manufacturing or analyzing apparatus 10, the signal processor 310 monitors vibration signals transmitted from the one or more vibration sensors 250 and compares the signal spectrum of detected vibration signal with the model vibration signal spectrum for a normal operation. When a deviation from the model vibration spectrum exceeds a threshold value, the signal processor 310 determines that there is an abnormal event within the semiconductor manufacturing or analyzing apparatus 10.

In other embodiments, the vibration signals for an abnormal operation of each of the operations and/or movements of various movable parts of the semiconductor manufacturing or analyzing apparatus 10 are repeatedly acquired and stored in the signal processor 310, and the signal processor generates a model for the vibration spectrum of an abnormal operation for each of the operations and/or movements of various movable parts of the semiconductor manufacturing or analyzing apparatus 10.

During an operation of the semiconductor manufacturing or analyzing apparatus 10, the signal processor 310 monitors vibration signals transmitted from the one or more vibration sensors 250 and determines whether the signal spectrum of detected vibration signal matches the model vibration signal spectrum for an abnormal operation. When the vibration spectrum the same as or similar to the model vibration spectrum for an abnormal operation is detected, the signal processor 310 determines that there is an abnormal event within the semiconductor manufacturing or analyzing apparatus 10. In such a case, the signal processor 310 can determine a type of the abnormal event based on the model vibration signal spectrum.

The same or similar operations, configurations, processes and/or operations as set forth above with respect to the embodiments where a microphone is used as the vibration monitor device can be applied to the embodiments where a vibration sensor is used as the vibration monitor device.

Various vibration sensors are utilized in the present embodiments. The vibration sensors include an accelerometer, a piezoelectric sensor, and a micro electro mechanical system (MEMS) sensor, etc. The vibration sensors can detect vibration in a frequency range from about 0.01 Hz to about 30 kHz, or a frequency range from about 10 Hz to about 10 kHz.

Figure 6:
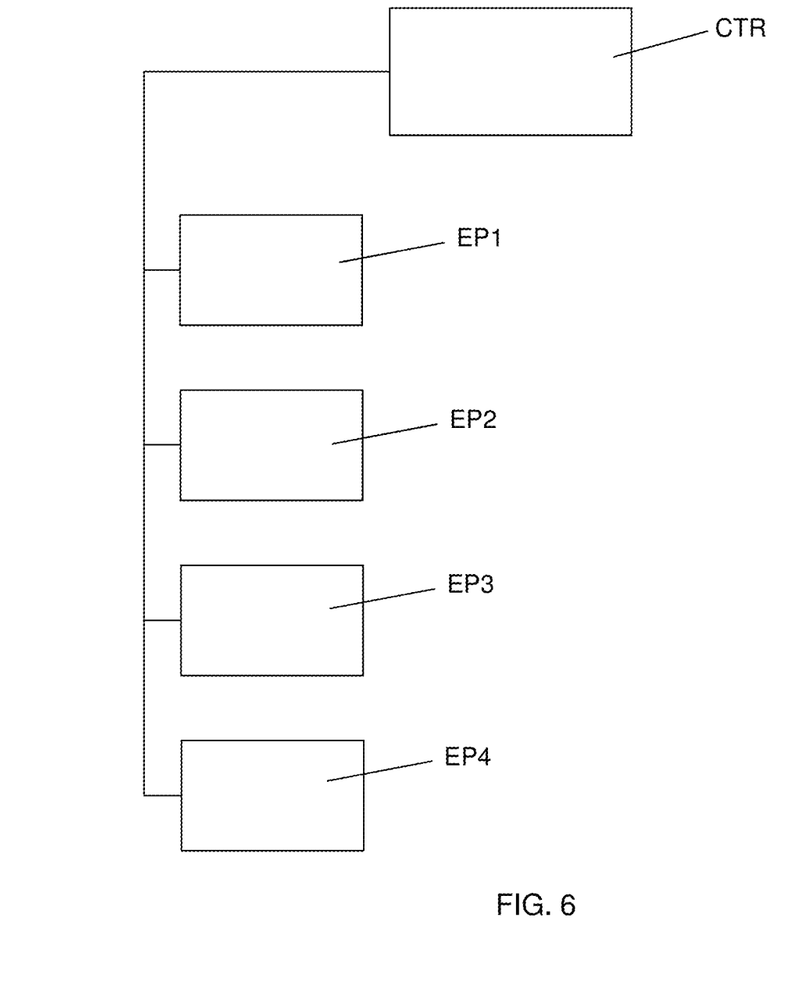
FIG. 6 is a schematic view of a system for controlling semiconductor manufacturing apparatuses in accordance with an embodiment.

FIG. 6 is a schematic view of a system for controlling semiconductor manufacturing apparatuses in accordance with an embodiment.

In FIG. 6, a plurality of semiconductor manufacturing or analyzing apparatuses EP1, EP2, EP3 and EP4 are communicably connected to a central server CTR. Each of the apparatuses EP1, EP2, EP3 and EP4 correspond to the semiconductor manufacturing or analyzing apparatus 10 as shown in FIGS. 1-3. In some embodiments, the plurality of semiconductor manufacturing or analyzing apparatuses EP1, EP2, EP3 and EP4 are the same type of apparatus. In other embodiments, the plurality of semiconductor manufacturing or analyzing apparatuses EP1, EP2, EP3 and EP4 include one or more different types of apparatus.

The central server CTR receives monitoring signals from each of the plurality of semiconductor manufacturing or analyzing apparatuses EP1, EP2, EP3 and EP4 to monitor the operation conditions thereof. In some embodiments, the apparatus controller 320 of each of the plurality of semiconductor manufacturing or analyzing apparatuses EP1, EP2, EP3 and EP4 transmits the monitoring signal to the central server CTR. In other embodiments, the central server CTR can operate a part of the functionalities of the apparatus controller 320 and/or the signal processor 310, and directly monitor the process conditions of each of the plurality of semiconductor manufacturing or analyzing apparatuses EP1, EP2, EP3 and EP4.

When the central server CTR receives a monitoring signal indicating an occurrence of an abnormal operation from one or more of the plurality of semiconductor manufacturing or analyzing apparatuses EP1, EP2, EP3 and EP4, the central server CTR issues a warning signal by, for example, displaying a warning message on a display and/or stops the operations of that apparatus(es).

In other embodiments, the central server CTR and/or the apparatus controller 320 monitors the characteristic sounds or vibrations and, based on a change in the characteristic sound or vibration, predicts or estimates the next maintenance timing. For example, the movable parts degrade by wear-and-tear by long-term operation, causing a change in the characteristic sounds or vibrations. By detecting such a change in the characteristic sounds or vibrations, the central server CTR and/or the apparatus controller 320 predict or estimate the next maintenance timing, so that mechanical failure that may damage the wafer and/or the apparatus can be prevented.

Figure 7:
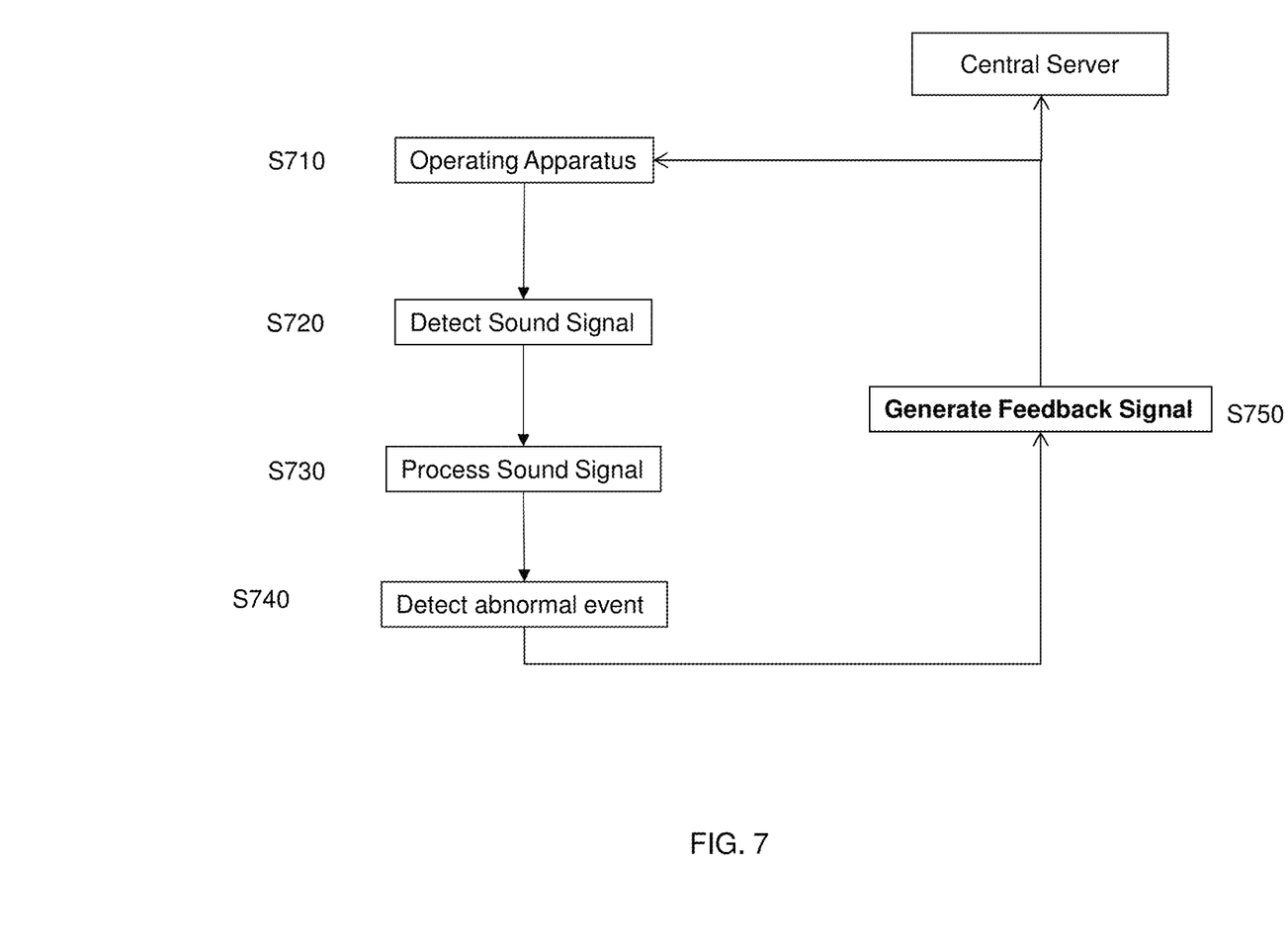
FIG. 7 depicts an illustrative flow chart for a method of controlling a manufacturing apparatus in accordance with an embodiment.

FIG. 7 shows an illustrative flow chart for a method of controlling one or more manufacturing apparatuses in accordance with an embodiment of the present disclosure. Apparatuses, devices, processes, configurations the same as or similar to those of the foregoing embodiments are employed in the following embodiments and the detailed explanation thereof may be omitted.

In S710, an apparatus (semiconductor manufacturing or analyzing apparatus 10) starts operating for processing or analyzing a wafer in accordance with a process recipe. In S720, the apparatus monitors sounds or vibrations inside and/or outside the apparatus. In S730, the apparatus processes the detected sounds or vibrations. In S740, the apparatus detects an abnormal event. Then, the apparatus issued a feedback signal at S750 and in some embodiments, the feedback signal is transmitted to a central server (e.g., CTR of FIG. 6).

Figure 8:
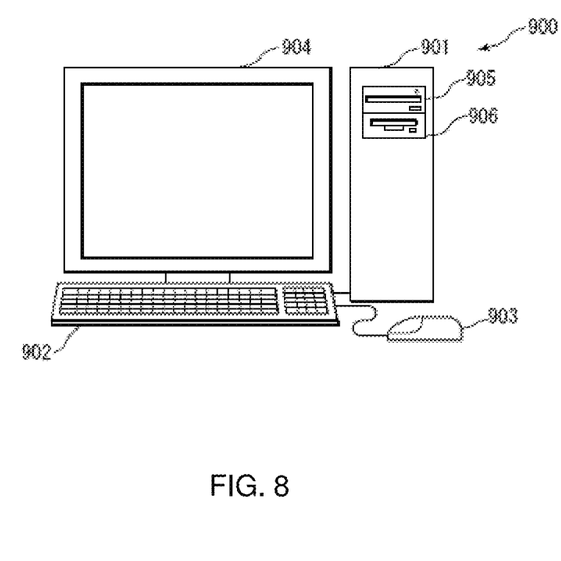
FIGS. 8 and 9 show a control apparatus according to an embodiment of the present disclosure.
Figure 9:
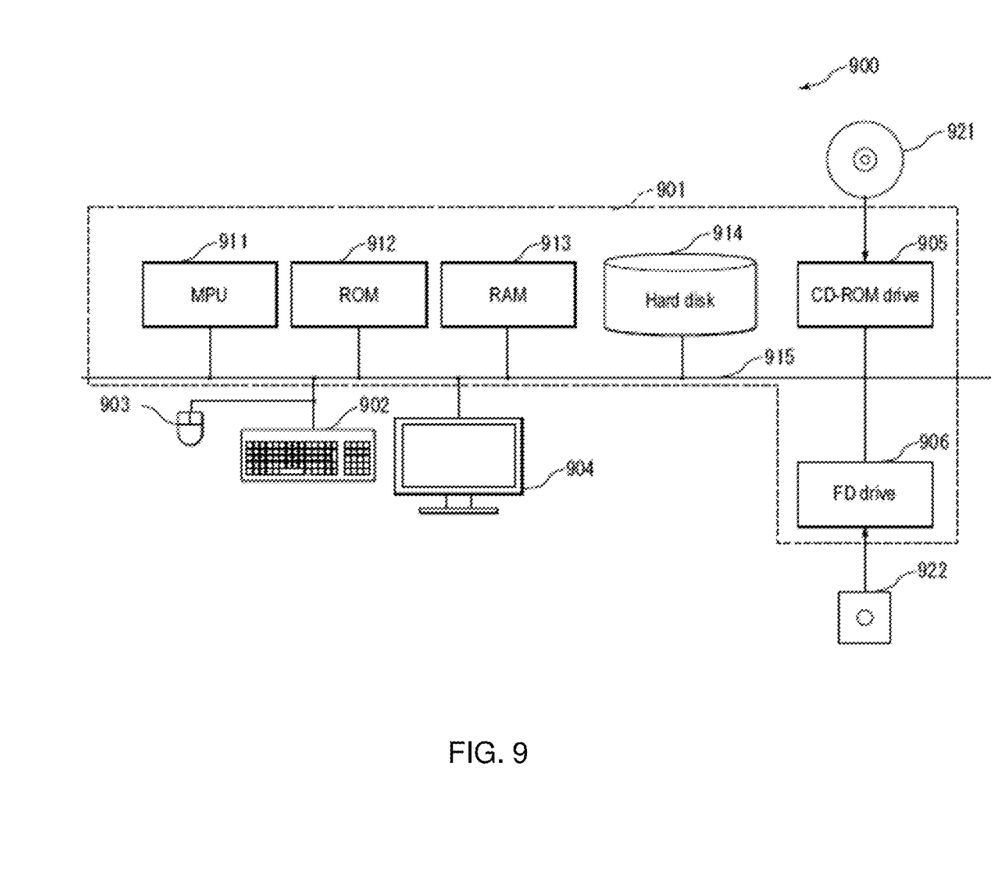

FIGS. 8 and 9 show a control apparatus according to an embodiment of the present disclosure. One or more of the signal processor 310, the apparatus controller 320 and the central server CTR as set forth above can be implemented by a computer system 900 shown in FIGS. 8 and 9.

FIG. 8 is a schematic view of a computer system that executes the one or more of the functionalities of the signal processor 310, the apparatus controller 310 and/or the central server CTR. The foregoing embodiments may be realized using computer hardware and computer programs executed thereon. In FIG. 8, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9 is a diagram showing an internal configuration of the computer system 900. In FIG. 9, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the aforementioned functions in the foregoing embodiments may be stored in an optical disk 921 or a magnetic disk 922, which are inserted into the optical disk drive 905 or the magnetic disk drive 906, and be transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the aforementioned functions in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

Further, the entirety of or a part of the programs to realize the aforementioned functions is a part of another program used for semiconductor manufacturing processes. In addition, the entirety of or a part of the programs to realize the functions is realized by a ROM made of, for example, a semiconductor device.

It is noted that the aforementioned embodiments can be applied to manufacturing or analyzing apparatuses for flat panel displays, such as an liquid crystal display and an electro luminescence display, of which manufacturing processes are similar to those for semiconductor devices.

It will be understood that not all advantages have been necessarily discussed herein, no particular advantage is required for all embodiments or examples, and other embodiments or examples may offer different advantages.

For example, by detecting and analyzing characteristic sounds produced by one or more movable parts of a semiconductor manufacturing or analyzing apparatus, it is possible to effectively detect an abnormal operation of the semiconductor manufacturing or analyzing apparatus. Further, by monitoring the characteristic sounds, it is possible to predict the next maintenance time and thus prevent damage to the wafer and/or the apparatus.

According to one aspect of the present disclosure, in a method of operating an apparatus for manufacturing or analyzing semiconductor wafers, sound in a process chamber of the apparatus during an operation of the apparatus is detected. An electrical signal corresponding to the detected sound is acquired by a signal processor. The acquired electrical signal is processed by the signal processor. An event during the operation of the apparatus is detected based on the processed electrical signal. The operation of the apparatus is controlled according to the detected event. In one or more of the foregoing or following embodiments, in response to detecting the event, the signal processor transmits a feedback signal corresponding to the detected event to a controller of the apparatus. The controller controls the operation of the apparatus based on the feedback signal. In one or more of the foregoing or following embodiments, the sound is detected by one or more microphones. In one or more of the foregoing or following embodiments, the sound is detected by multiple microphones having different detection frequency ranges. In one or more of the foregoing or following embodiments, at least one of the multiple microphones has a detection frequency range in an audible sound range. In one or more of the foregoing or following embodiments, wherein at least one of the multiple microphones has a detection frequency range in an ultrasonic sound range. In one or more of the foregoing or following embodiments, the multiple microphones are disposed inside the process chamber. In one or more of the foregoing or following embodiments, the multiple microphones are disposed inside and outside the process chamber. In one or more of the foregoing or following embodiments, the apparatus further includes a wafer handler for transferring a semiconductor wafer, and at least one of the multiple microphones is disposed on the wafer handler. In one or more of the foregoing or following embodiments, the apparatus further includes a movable wafer stage on which a semiconductor wafer is placed, and at least one of the multiple microphones is disposed on the movable wafer stage. In one or more of the foregoing or following embodiments, the event includes at least one selected the group consisting of a mechanical error, a mechanical failure, and a collision of two or more parts. In one or more of the foregoing or following embodiments, processing the electrical signal includes at least one selected from the group consisting of filtering the electrical signal to remove noise or ambient sound from the detected sound, detecting a position of a source of the detected sound, processing the electrical signal in a time domain or in a frequency domain, and recognizing patterns in the detected sound as corresponding to predetermined events during the operation of the apparatus. In one or more of the foregoing or following embodiments, the recognizing patterns includes matching patterns of sounds with known events based on event models or using previously learned correspondence between patterns of sounds and events.

In accordance with another aspect of the present disclosure, in a method operating multiple apparatuses for manufacturing or analyzing semiconductor wafers, each of the multiple apparatuses includes a process chamber. In the method, sound in a process chamber of the apparatus during an operation in each of the multiple apparatuses is detected. Electrical signals from the multiple apparatuses corresponding to the detected sound are acquired by one or more computers. The one or more computers process the acquired electrical signals. One or more events during the operation of the each of the multiple apparatuses are detected based on the processed electrical signals. The operation of the each of the multiple apparatuses is controlled according to the detected one or more events. In one or more of the foregoing or following embodiments, the multiple apparatus are respectively one selected from the group consisting of a plasma etching apparatus, a chemical vapor deposition (CVD) apparatus, a sputtering deposition apparatus, an atomic layer deposition (ALD) apparatus, an epitaxial growth apparatus, an annealing apparatus, a thermal oxidation apparatus, an ion implantation apparatus, a lithography apparatus, a wet process apparatus, a critical dimension (CD) measurement apparatus, a scanning electron microscope (SEM) and an optical microscope, a film thickness measurement apparatus, an overlay measurement apparatus, a particle inspection apparatus, a defect inspection apparatus, and an electrical property measurement apparatus. In one or more of the foregoing or following embodiments, each of the multiple apparatuses includes a wafer handler for transferring a semiconductor wafer, and the sound includes sound produced by the wafer handler when moving. In one or more of the foregoing or following embodiments, each of the multiple apparatuses includes a movable wafer stage on which a semiconductor wafer is placed, and the sound includes sound produced by the wafer stage when moving. In one or more of the foregoing or following embodiments, when the detected one or more events correspond to a predetermined event that indicate a mechanical failure, operation of one or more apparatuses in which the one or more events are detected are stopped.

In accordance with another aspect of the present disclosure, in a method of operating an apparatus for manufacturing or analyzing semiconductor wafers, vibration in a process chamber of the apparatus during an operation of the apparatus is detected by one or more sensors. An electrical signal corresponding to the detected vibration is acquired by a signal processor. The signal processor processes the acquired electrical signal. An event during the operation of the apparatus is detected based on the processed electrical signal. The operation of the apparatus is controlled according to the detected event.

In accordance with one aspect of the present disclosure, an apparatus for manufacturing or analyzing semiconductor wafers includes a wafer handler for transferring a semiconductor wafer, a wafer stage on which a semiconductor wafer is placed, a process chamber in which the wafer handler and the wafer stage are disposed, one or more microphones disposed for detecting sound produced by the apparatus during an operation of the apparatus and transmitting an electrical signal corresponding to the detected sound, a signal processor configured to receive the electrical signal from the one or more microphones, process the electrical signal, and detect an event during the operation of the apparatus, and a controller for controlling the operation of the apparatus according to the detected event. In one or more of the foregoing or following embodiments, the signal processor, in response to detecting the event, transmits a feedback signal corresponding to the detected event to the controller, and the controller controls the operation of the apparatus based on the feedback signal. In one or more of the foregoing or following embodiments, the apparatus includes multiple microphones for detecting the sound. In one or more of the foregoing or following embodiments, the multiple microphones have different detection frequency ranges. In one or more of the foregoing or following embodiments, at least one of the multiple microphones has a detection frequency range in an audible sound range. In one or more of the foregoing or following embodiments, at least one of the multiple microphones has a detection frequency range in an ultrasonic sound range. In one or more of the foregoing or following embodiments, the multiple microphones are disposed inside and outside the process chamber. In one or more of the foregoing or following embodiments, the apparatus further includes a wafer handler for transferring a semiconductor wafer, and at least one of the multiple microphones is disposed on the wafer handler. In one or more of the foregoing or following embodiments, the apparatus further includes a movable wafer stage on which a semiconductor wafer is placed, and at least one of the multiple microphones is disposed on the movable wafer stage. In one or more of the foregoing or following embodiments, the event includes at least one selected the group consisting of a mechanical error, a mechanical failure, and a collision of two or more parts. In one or more of the foregoing or following embodiments, processing the electrical signal includes at least one selected from the group consisting of filtering the electrical signal to remove noise or ambient sound from the detected sound, detecting a position of a source of the detected sound, processing the electrical signal in a time domain or in a frequency domain, and recognizing patterns in the detected sound as corresponding to predetermined events during the operation of the apparatus. In one or more of the foregoing or following embodiments, the recognizing patterns include matching patterns of sounds with known events based on event models or using previously learned correspondence between patterns of sounds and events. In one or more of the foregoing or following embodiments, the apparatus is one selected from the group consisting of a plasma etching apparatus, a chemical vapor deposition (CVD) apparatus, a sputtering deposition apparatus, an atomic layer deposition (ALD) apparatus, an epitaxial growth apparatus, an annealing apparatus, a thermal oxidation apparatus, an ion implantation apparatus, a lithography apparatus and a wet process apparatus. In one or more of the foregoing or following embodiments, the apparatus is one selected from the group consisting of a critical dimension (CD) measurement apparatus, a scanning electron microscope (SEM) and an optical microscope, a film thickness measurement apparatus, an overlay measurement apparatus, a particle inspection apparatus, a defect inspection apparatus, and an electrical property measurement apparatus.

In accordance with another aspect of the present disclosure, a system for manufacturing or analyzing semiconductor wafers includes a central server and multiple semiconductor manufacturing or analyzing apparatuses communicably connected to the central server. Each of the multiple semiconductor manufacturing or analyzing apparatuses includes a wafer handler for transferring a semiconductor wafer, a wafer stage on which a semiconductor wafer is placed, a process chamber in which the wafer handler and the wafer stage are disposed, one or more microphones disposed for detecting sound produced by the apparatus during an operation of the apparatus and transmitting an electrical signal corresponding to the detected sound, and one or more computers configured to receive the electrical signal from the one or more microphones, process the electrical signal, detect an event during the operation of the apparatus and control the operation of the apparatus according to the detected event. In one or more of the foregoing or following embodiments, each of the multiple semiconductor manufacturing or analyzing apparatuses further includes one or more microphones. In one or more of the foregoing or following embodiments, each of the multiple semiconductor manufacturing or analyzing apparatuses further includes multiple microphones having different detection frequency ranges. In one or more of the foregoing or following embodiments, at least one of the multiple microphones has a detection frequency range in at least one of an audible sound range and an ultrasonic sound range. In one or more of the foregoing or following embodiments, each of the multiple semiconductor manufacturing or analyzing apparatuses further includes a wafer handler for transferring a semiconductor wafer, and a wafer stage on which the semiconductor wafer is placed. At least one of the multiple microphones is disposed on at least one of the wafer handler and the wafer stage.

In accordance with another aspect of the present disclosure, an apparatus for manufacturing or analyzing semiconductor wafers includes a wafer handler for transferring a semiconductor wafer, a wafer stage on which a semiconductor wafer is placed, a process chamber in which the wafer handler and the wafer stage are disposed, one or more sensors disposed for detecting vibrations produced by the apparatus during an operation of the apparatus and transmitting an electrical signal corresponding to the detected vibrations, a signal processor configured to receive the electrical signal from the one or sensors, process the electrical signal, and detect an event during the operation of the apparatus, and a controller for controlling the operation of the apparatus according to the detected event.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating an apparatus for manufacturing or analyzing semiconductor wafers, the method comprising:
    detecting sound in a process chamber of the apparatus during an operation of the apparatus;
    acquiring an electrical signal corresponding to the detected sound by a signal processor;
    processing, by the signal processor, the acquired electrical signal;
    detecting an event during the operation of the apparatus based on the processed electrical signal; and
    controlling the operation of the apparatus according to the detected event,
    wherein the method further comprises:
    when an abnormal event is detected, it is determined whether the abnormal even is self-recoverable, and
    upon determining that the abnormal even is self-recoverable, continuing the operation of the apparatus.

2. The method of claim 1, further comprising:
    in response to detecting the event, transmitting, by the signal processor, a feedback signal corresponding to the detected event to a controller of the apparatus,
    wherein the controller controls the operation of the apparatus based on the feedback signal.

3. The method of claim 1, wherein the sound is detected by one or more microphones.

4. The method of claim 1, wherein the sound is detected by multiple microphones having different detection frequency ranges.

5. The method of claim 4, wherein at least one of the multiple microphones has a detection frequency range in an audible sound range.

6. The method of claim 4, wherein at least one of the multiple microphones has a detection frequency range in an ultrasonic sound range.

7. The method of claim 4, wherein:
    the apparatus further includes a wafer handler for transferring a semiconductor wafer, and
    at least one of the multiple microphones is disposed on the water handler.

8. The method of claim 4, wherein:
    the apparatus further includes a movable wafer stage on which a semiconductor wafer is placed, and
    at least one of the multiple microphones is disposed on the movable wafer stage.

9. The method of claim 1, wherein the event includes at least one selected the group consisting of a mechanical error, a mechanical failure, and a collision of two or more parts.

10. The method of claim 1, wherein processing the electrical signal comprises at least one selected from the group consisting of filtering the electrical signal to remove noise or ambient sound from the detected sound, and processing the electrical signal in a frequency domain.

11. The method of claim 10, wherein the recognizing patterns comprises matching patterns of sounds with known events based on event models or using previously learned correspondence between patterns of sounds and events.

12. A method of operating an apparatus for manufacturing or analyzing semiconductor wafers, the method comprising:
transferring a semiconductor wafer by an wafer handler from a first place to a second place;
detecting sound in a process chamber of the apparatus during transferring the semiconductor wafer;
acquiring an electrical signal corresponding to the detected sound by a signal processor;
processing, by the signal processor, the acquired electrical signal;
detecting an event during the transferring the semiconductor wafer of the apparatus based on the processed electrical signal; and
controlling the transferring the semiconductor wafer according to the detected event,
wherein processing the electrical signal comprises at least one selected from the group consisting of filtering the electrical signal to remove noise or ambient sound from the detected sound, detecting a position of a source of the detected sound, and processing the electrical signal a frequency domain.

13. The method of claim 12, further comprising:
in response to detecting the event, transmitting, by the signal processor, a feedback signal corresponding to the detected event to a controller of the wafer handler,
wherein the controller controls the transferring the semiconductor wafer of the apparatus based on the feedback signal.

14. The method of claim 12, wherein the sound is detected by one or more microphones.

15. The method of claim 12, wherein the sound is detected by multiple microphones having different detection frequency ranges.

16. The method of claim 15, wherein at least one of the multiple microphones has a detection frequency range in an audible sound range.

17. The method of claim 15, wherein at least one of the multiple microphones has a detection frequency range in an ultrasonic sound range.

18. A method of operating a plurality of apparatuses for manufacturing or analyzing semiconductor wafers, the method comprising:
detecting sound or vibration in a process chamber of each of the plurality of apparatuses during an operation of each of the plurality of apparatuses;
acquiring an electrical signal corresponding to the detected sound or vibration by a signal processor provided to each of the plurality of apparatuses;
processing, by the signal processor, the acquired electrical signal;
outputting, from each of the plurality of apparatuses, the acquired electrical signal to a server,
wherein the server, based on a change in a characteristic sound or vibration, predicts or estimates a next maintenance timing.

19. The method of claim 18, wherein the sound in the process chamber is detected, and the sound is detected by multiple microphones.

20. The method of claim 18, wherein the vibration is detected and the vibration is detected by one of an accelerometer, a piezoelectric sensor, or a micro electro mechanical system (MEMS) sensor.

* * * * *